United States Patent
Thompson et al.

(10) Patent No.: US 9,500,710 B2
(45) Date of Patent: Nov. 22, 2016

(54) GENERATOR NEUTRAL GROUND MONITORING SYSTEM AND METHOD

(71) Applicants: Edward D. Thompson, Casselberry, FL (US); James F. Lau, Orlando, FL (US)

(72) Inventors: Edward D. Thompson, Casselberry, FL (US); James F. Lau, Orlando, FL (US)

(73) Assignee: SIEMENS ENERGY, INC., Orlando, FL (US)

( * ) Notice: Subject to any disclaimer, the term of this patent is extended or adjusted under 35 U.S.C. 154(b) by 912 days.

(21) Appl. No.: 13/651,646

(22) Filed: Oct. 15, 2012

(65) Prior Publication Data

US 2014/0107955 A1    Apr. 17, 2014

(51) Int. Cl.
  *G01R 31/34*    (2006.01)
  *G01R 31/02*    (2006.01)

(52) U.S. Cl.
  CPC .......... *G01R 31/343* (2013.01); *G01R 31/025* (2013.01)

(58) Field of Classification Search
  CPC .. G01R 31/11; G01R 31/025; G01R 31/343; G01R 31/088; G01R 31/027; H02J 1/00; Y04S 10/522; Y04S 10/30; H02H 3/33
  USPC ............ 324/509, 533, 536, 522, 76.11, 500, 324/512, 547; 702/66, 77, 64, 58, 67, 75, 702/71
  See application file for complete search history.

(56) References Cited

U.S. PATENT DOCUMENTS

| | | | |
|---|---|---|---|
| 4,771,355 A | | 9/1988 | Emery et al. |
| 5,498,956 A | * | 3/1996 | Kinney ................ G01R 21/133 324/142 |
| 5,648,723 A | * | 7/1997 | Williams ............. G01R 31/025 324/509 |
| 5,832,413 A | * | 11/1998 | Benco et al. ................... 702/77 |
| 6,421,618 B1 | * | 7/2002 | Kliman ................ G01R 31/025 324/500 |
| 6,452,769 B1 | * | 9/2002 | Sohde ...................... H02H 9/08 307/18 |
| 7,719,285 B2 | | 5/2010 | Johansson et al. |
| 2002/0089335 A1 | * | 7/2002 | Williams ............... G01R 31/11 324/533 |
| 2004/0264082 A1 | * | 12/2004 | Suliman .................. F03D 9/003 361/62 |
| 2007/0279068 A1 | * | 12/2007 | Harres .......................... 324/522 |
| 2009/0067101 A1 | | 3/2009 | Nelson |
| 2009/0167314 A1 | * | 7/2009 | Hoffmann ............ G01R 31/025 324/509 |
| 2010/0088048 A1 | * | 4/2010 | Berggren et al. ................ 702/58 |
| 2010/0090789 A1 | * | 4/2010 | Schluter .................. H01F 30/10 336/192 |
| 2011/0085272 A1 | * | 4/2011 | Schweitzer, III ........ H02H 7/06 361/47 |
| 2014/0136002 A1 | * | 5/2014 | Gopalakrishnan ....... H04Q 9/00 700/286 |

\* cited by examiner

*Primary Examiner* — John Breene
*Assistant Examiner* — Jeffrey Aiello

(57) ABSTRACT

Fault analysis and detection involving a generator neutral ground includes monitoring a voltage waveform across a neutral grounding transformer of a generator. During monitoring of the voltage waveform a sample of the voltage waveform is acquired. Previously, a number of similar past samples of the monitored waveform were acquired and stored as well. The present sample is compared to one or more of these stored, past samples so that, based on a similarity between the present sample to the past samples, a generator fault indicated by the present sample can be identified. Identifying the generator fault can include recognizing that it is presently occurring or that it may occur in a predictable timeframe. Additionally, identifying a component of the generator that caused, or will cause, the generator fault can be identified as well. A diagnostic message or control signal based on the identified generator fault can then be generated.

20 Claims, 7 Drawing Sheets

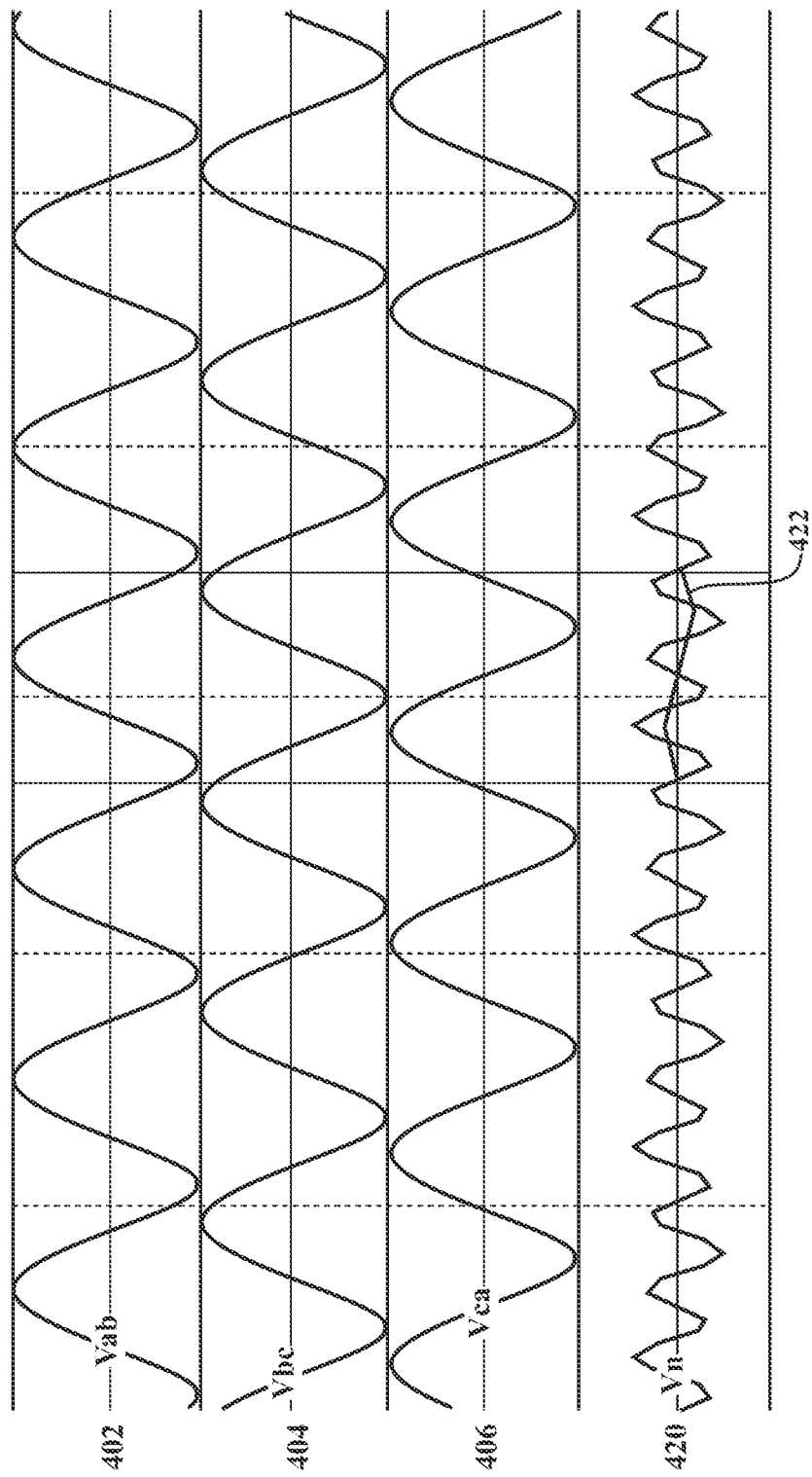

GENERATOR NEUTRAL GROUND MONITORING SYSTEM AND METHOD

FIELD OF THE INVENTION

The present invention relates to the field of electrical power generators and, more particularly, monitoring the operation of electrical power generators.

BACKGROUND OF THE INVENTION

Electrical power generators convert mechanical power into one or more electrical currents, one from each coil, or winding. It is beneficial to protect electrical power generators against external faults and internal faults. Generators can be protected against external faults by several circuit breakers that isolate the faults that could occur in the power plant network (e.g., transformers, buses, lines . . . ). At the same time, electrical power generators can also be protected against faults that could occur inside the machine itself.

Many electrical power generators in power plants are of a three-phase design that utilizes a "Y" winding configuration. In this type of design, all three phases of the stator are connected at one end, typically by a large bus bar, which corresponds to the center of the "Y". Usually, this bus bar is also grounded. In most instances the grounding point that is selected is the power plant's earth ground and the bus bar is connected to the ground through a transformer that is commonly referred to as a neutral grounding transformer.

In an ideal operation, the current flow to ground would hypothetically be nearly zero. A very small current will flow to ground through the generator side of the neutral grounding transformer, largely due to capacitance of the complete generator, and all components tied to it electrically. When a fault to ground occurs in any of these electrically connected components the current will rise and can reach levels up to 20 Amperes. The transformer is typically designed to limit ground fault current to 20 Amperes to minimize consequential damage from the ground fault.

For example, a ground fault in a generator stator winding is one of the most frequent types of internal electrical generator fault. A ground fault can be caused by, for example, physical damage to the stator winding or aging of the insulation of the stator and can cause additional damage to the stator and cause the electrical power generator to fail.

In the past, the current passing through a neutral grounding circuit (e.g., that includes a neutral grounding transformer and an impedance) has been measured by monitoring the voltage across that impedance. When the voltage exceeds a predetermined threshold value a protection relay will trip after a short time delay. The short time delay is typically selected to allow spurious conditions to clear in order to prevent false trips of the protection relay which would unnecessarily stop operation of the electrical power generator.

The protection technique of using a relay relies simply on a detected voltage level and may miss other events that are evidence of a fault or are evidence of an impending fault. There remains a need for additional techniques and systems to more accurately and more robustly monitor an electrical power generator in order to provide fault protection other than a simple over-voltage trip relay.

SUMMARY OF THE INVENTION

Accordingly aspects of the present invention are related to fault analysis, detection, and prediction involving a generator neutral ground that includes monitoring a voltage waveform across a neutral grounding transformer of a generator. During monitoring of the voltage waveform a sample of the voltage waveform is acquired. Previously, a number of similar past samples of the monitored waveform were acquired and stored as well. The present sample is compared to one or more of these stored, past samples so that, based on a similarity between the present sample to the one or more past samples, a generator fault indicated by the present sample can be identified. Identifying the generator fault can include recognizing that it is presently occurring or that it may occur in a predictable timeframe. Additionally, identifying a component of the generator that caused, or will cause, the generator fault can be identified as well. A diagnostic message or control signal based on the identified generator fault can then be generated.

Additional aspects of the present invention relate to a system that includes a voltage monitoring circuit configured to monitor a voltage waveform across a neutral grounding transformer of a generator and a signal receiver configured to acquire a present sample of the voltage waveform. The system also includes a comparator configured to compare the present sample to one or more of a plurality of past samples of the voltage waveform that have been previously acquired and stored. Ultimately, the system includes a fault analyzer configured to identify a generator fault associated with the present sample based on a similarity between the present sample to the one or more past samples. Identifying the generator fault can include recognizing that it is presently occurring or that it may occur in a predictable timeframe. Additionally, identifying a component of the generator that caused, or will cause, the generator fault can be identified as well. A diagnostic message or control signal based on the identified generator fault can then be generated.

BRIEF DESCRIPTION OF THE DRAWINGS

While the specification concludes with claims particularly pointing out and distinctly claiming the present invention, it is believed that the present invention will be better understood from the following description in conjunction with the accompanying Drawing Figures, in which like reference numerals identify like elements, and wherein:

FIGS. 4A-D depict various waveforms associated with an electrical power generator including different neutral voltage waveforms of an electrical power generator.

DETAILED DESCRIPTION OF THE INVENTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

Figure 1:
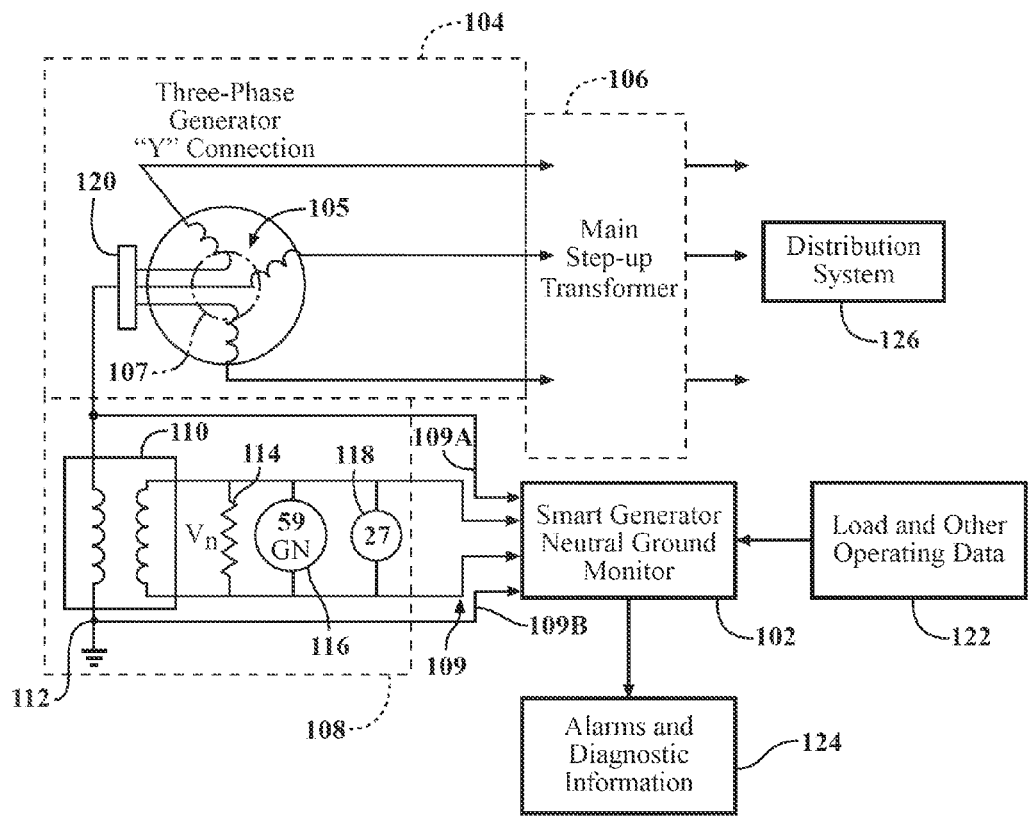
FIG. 1 illustrates an electrical power generator system with a neutral ground monitor in accordance with the principles of the present invention.

Techniques, systems and methods involving improved monitoring of a generator neutral ground voltage waveform are described herein. FIG. 1 illustrates an electrical power generator system with a neutral ground monitor in accordance with the principles of the present invention. With respect to FIG. 1, a smart generator neutral ground monitor (SGNGM) 102 is depicted within the context of the more general environment of an electrical power generator system. While an electrical generator 104 can be assembled with a variety of different winding configurations, many generators in power plants are of a three phase design that utilizes a Y winding configuration 105, as shown in FIG. 1. The principles and techniques described herein do not require a Y winding configuration but may be applicable to other winding configurations as well (e.g., delta configuration).

In the winding configuration of FIG. 1, all three phases are connected at the neutral end to a bus bar 120 that corresponds to the center 107 of the Y. The bus bar 120 is grounded through a high-impedance circuit, such as a transformer 110, to the power plant's earth ground 112. During normal operation of the generator 104, the current flow from the neutral bus bar 120 to the ground 112 should be minimal; although inherent capacitance between the windings 105 of the generator 104 and the ground 112 will result in at least some current flow.

A neutral grounding transformer 108 can include a number of other devices in addition to the transformer windings 110. For example, a resistor 114 can be in parallel to the transformer windings 110 so that current flowing through the resistor 114 will produce a voltage potential across the terminals of the resistor 114. An over-voltage protection relay 116 can be included such that if the voltage across the resistor 116 exceeds a predetermined value for more than a predetermined time period, the relay can trip and stop operation of the generator 104. Typically, the over-voltage trip relay is tuned for the primary operating frequency (e.g., 60 Hz) of one of the windings of the generator 104. Also, an under-voltage trip relay 118 can be included that detects voltage conditions relating to one or more harmonic frequencies (e.g., third harmonic) of the primary operating frequency of the generator 104.

In either case, the over-voltage relay 116 or the under-voltage relay 118 detects a near-instantaneous voltage level value across the resistor 114 that is indicative of the current flowing through the transformer 110 to the ground 112.

In addition to simply detecting a dangerous voltage condition and stopping operation of the generator 104, the SGNGM 102, in accordance with the principles of the present invention uses the neutral ground voltage waveform, historical data, operating conditions, and other information to detect, prevent and predict faults rather than simply stopping operation of a generator. Thus, in embodiments of the present invention, the SGNGM 102 can eliminate the over-voltage relay 116 and the under-voltage relay 118 by monitoring the neutral ground voltage waveform for over- and under-voltage conditions in order to provide equivalent control signals to stop operation of the generator 104.

A stator ground fault is the most common type of fault to which generators are subjected. Stator ground faults can, for example, be caused by the insulation degradation in the windings 105 of the generator 104 as well as environmental influences such us moisture or oil in combination with dirt which settles on the coil surfaces outside the stator slots. This often leads to electrical discharges in the winding which damages the insulation around the winding and shorts the winding to ground. In general, a stator ground fault is a single-phase to ground fault; or, in other words, it involves one of the three windings 105 of the generator 104.

There are at least two reasons to predict and prevent generators from stator ground faults. Firstly, they are faults and that means they are irregular situations in the work of the generator 104 causing non-desirable voltages, currents, oscillations or damage. Secondly, an undetected and non-cleared ground fault could develop into a phase-to-phase fault or into an inter-winding fault if another single-phase to ground fault occurs. Since a phase-to-phase fault and an inter-winding fault are short-circuits they are associated with immediate damage to the generator 104 since the resulting short-circuit current could be of devastating magnitude during operation.

In the system depicted in FIG. 1, the neutral ground voltage waveform 109 across the resistor 114 is acquired by the SGNGM 102. As described more fully below, the SGNGM 102 analyzes the waveform 109 to determine whether or not the voltage waveform 109 is indicative of an operating fault of the generator 104 or is indicative of conditions that have preceded operating faults in the past. FIG. 1 also depicts an alternative waveform to waveform 109 that provides similar information that can be analyzed by the SGNGM 102. In particular, the voltage waveform across the primary winding of the transformer 110 can be captured using the two leads 109A and 109B. One of ordinary skill will recognize that in the description below, this waveform across the primary winding of the transformer 110 can be utilized as an alternative to waveform 109 or in addition to waveform 109. Using the current generator load and other operating conditions 122, including unit operating data, from the various components of the electrical generator system's environment, as well as historical data, the SGNGM 102 is able to detect generator faults much earlier than previous devices, and potentially identify the nature of the fault, as well as estimating a time to failure. In this way, repairs can be planned in advance instead of the "forced outage" situation caused by a voltage protection trip relay (e.g., 116, 118). One benefit of preventing forced outages is that such occurrences are costly to electrical generating utilities since the absence of planning results in longer equipment outage time, and the extra outage time reduces the opportunity to produce electricity. The earlier a problem is detected; the earlier repairs can be performed. Early repairs minimize the potential damage caused by any winding problem and reduce repair costs as well.

One of ordinary skill will recognize that there are also other alternative techniques for electrically coupling the SGNGM 102 to the neutral bar 120 such that a waveform representing the voltage between the neutral bar 120 and the ground 112 can be obtained. For example, the SGNGM 102 can be coupled through a capacitive network directly attached to the neutral bar 120.

For completeness, FIG. 1 includes a main step-up transformer 106 that prepares the electricity generated from the generator 104 for the power transmission system.

Figure 2:
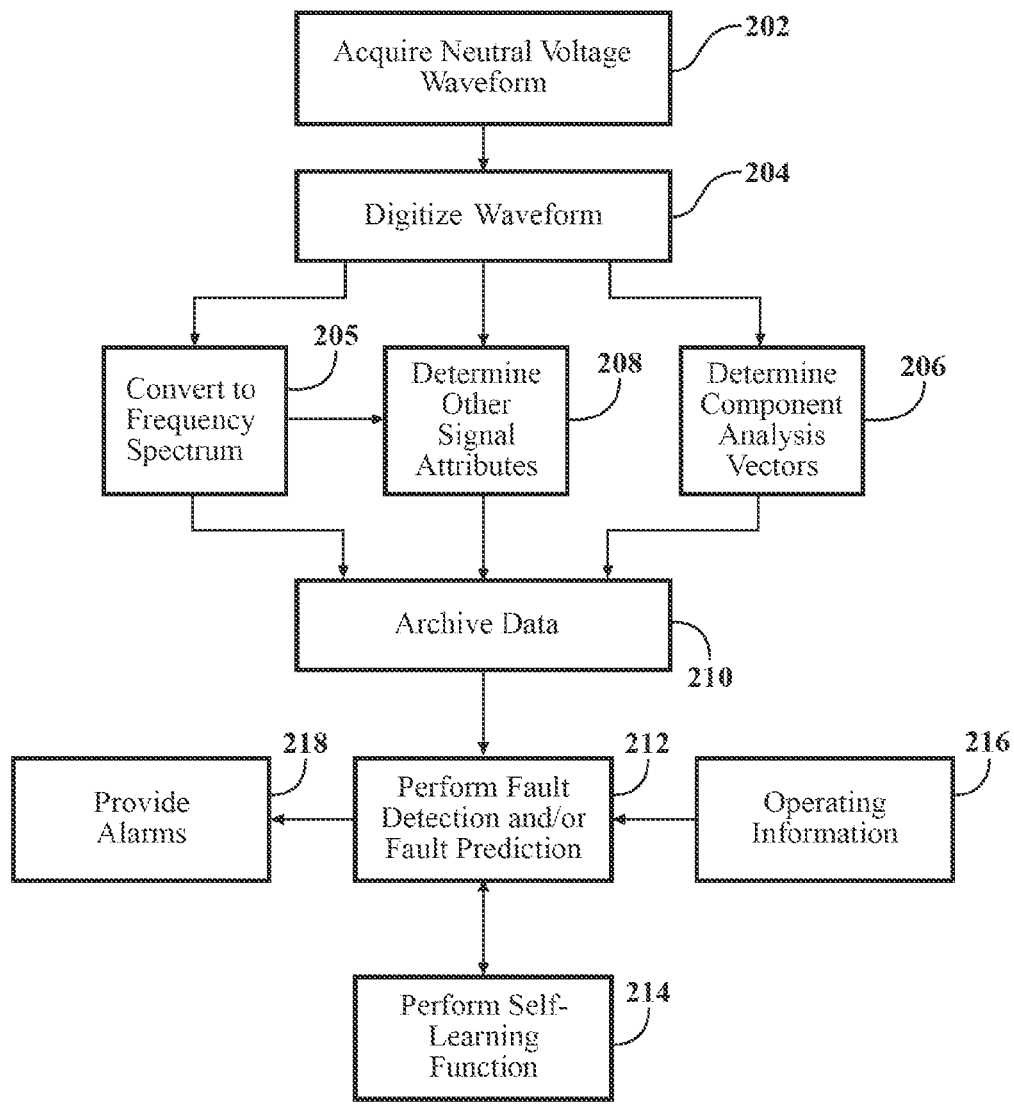
FIG. 2 is a flowchart of an exemplary method of monitoring an electrical power generator in accordance with the principles of the present invention.

FIG. 2 is a flowchart of an exemplary method of monitoring an electrical power generator in accordance with the principles of the present invention. The flowchart of FIG. 2 represents the functional steps that can be performed by the SGNGM 102 of FIG. 1. In step 202, the SGNGM 102 can acquire a neutral ground waveform signal that is typically analog in nature. The signal acquisition can involve well-known filtering techniques such that noise and other unwanted aspects of the voltage waveform can be eliminated. Once a desired signal is acquired, then the SGNGM 102 may convert that analog signal to a digital format, in step 204, and convert the digital signal into a frequency-based signal, in step 205.

During signal acquisition, various sample sizes and frequencies can be utilized without departing from the scope of the present invention. For example, the analog voltage waveform can be repeatedly sampled for a duration of two or more cycles of the primary generator operating frequency and can be sampled about every 100 to 200 cycles. Additionally, sampling can occur on a non-regular schedule in response to a trigger condition being detected (e.g., a voltage level, a load level, other power plant conditions, etc.). Such trigger conditions may be indicative of problems within the power plant and, thus, voltage waveforms can be sampled that correlate to other power plant conditions. Also in order to detect more transient conditions, other sampling parameters could be used. For example, sampling rates near the megahertz range could be used with sample duration being a fraction of a second. One of ordinary skill will recognize that different sampling rates and sample durations can be selected based on various transient signals desired to be detected.

The time-based signal that is acquired and digitized by the SGNGM could be used without conversion into the frequency domain but some signal analysis techniques benefit from having a frequency domain signal to analyze. Accordingly, Fourier analysis and transformation of the time-domain signal can be performed by the SGNGM 102 to produce a frequency-domain representation of the neutral ground voltage waveform 109.

In step 206, the SGNGM 102 can determine component analysis vectors that characterize the voltage waveform. Two examples of component analysis techniques that could be utilized are principal component analysis and independent component analysis.

Principal component analysis (PCA) is a mathematical procedure that uses an orthogonal transformation to convert a set of observations of possibly correlated variables into a set of values of uncorrelated variables called principal components. The number of principal components is less than or equal to the number of original variables. This transformation is defined in such a way that the first principal component has as high a variance as possible (that is, accounts for as much of the variability in the data as possible), and each succeeding component in turn has the highest variance possible under the constraint that it be orthogonal to, or uncorrelated with, the preceding components.

Independent component analysis (ICA) is a statistical and computational technique for revealing hidden factors that underlie sets of random variables, measurements, or signals. ICA defines a generative model for the observed multivariate data, which is typically given as a large database of samples. In the model, the data variables are assumed to be linear mixtures of some unknown latent variables, and the mixing system is also unknown. The latent variables are assumed nongaussian and mutually independent, and they are called the independent components of the observed data. These independent components, also called sources or factors, can be found by ICA.

One of ordinary skill will recognize that there are other component analysis techniques that can be used without departing from the scope of the present invention. As a result of any of these techniques, a set of vectors is generated that characterize the sampled voltage waveform.

In addition to the component analysis vectors that can be generated in step 206, other attributes of the voltage waveform are also determined by the SGNGM 102, in step 208. For example, the frequency having the maximum value in the waveform sample can be determined. Additionally, the value of the waveform at different, predetermined frequencies can be determined as well. Also, the time-domain current level or time-domain voltage level (either instantaneous or averaged) across the resistor 114 can be determined as well. As shown in FIG. 2 the other signal attributes determined in step 208 can be based on a time-domain signal, a frequency-domain signal, or both.

Historical operating information may be useful when performing fault analysis and detection; accordingly, in step 210, the SGNGM 102 stores the waveform and other information, that was determined in steps 205, 206, and 208, for later use. Because the amount of information acquired by the SGNGM 102 may grow to be very large, the stored information can be archived in a database system that allows indexing the data by different variables and attributes. In this manner, the stored data can be searched and retrieved by a number of different techniques both quickly and efficiently. In other words, the waveform information can be identified based on time and date but can also be identified by voltage levels, frequency maxima information and other waveform attributes.

In step 212, the SGNGM 102 utilizes the neutral voltage waveform characterization information to predict or detect generator faults. In addition to the waveform characterization information, other power plant operating information 216 can be utilized in performing fault detection and prediction. For example, the SGNGM 102 can combine information from other plant sources to more accurately predict an expected waveform and amplitude given current operating conditions. Often faults are preceded by spurious spikes and changes in a normal waveform. This information is ignored by simple trip relays but is utilized by the SGNGM 102 in accordance with the principles of the present invention. For instance, since the third harmonic frequency's level in the neutral ground voltage waveform is known to vary with the generator load, once the characteristic level has been learned by the SGNGM 102, a diagnostic or alarm signal can be initiated when the level of the third harmonic frequency falls below this expected level. This condition may be indicative of a fault near the neutral end of one of the generator windings. The data acquisition and historical archiving of data performed by the SGNGM 102 allow that expected level to be determined under real operating conditions rather than estimated.

One of ordinary skill will recognize that there are a variety of different pattern recognition techniques that can be utilized to analyze the signal attributes acquired and stored by the SGNGM 102. For example, expert systems, neural networks, and state-based analysis tools can be applied. The purpose of such analytical tools is to identify waveforms, patterns, and changes in waveforms that are indicative of operating conditions that suggest a generator fault is occurring or will occur at an estimated time in the future. In step 218, this analysis results in the generation of alarm or diagnostic signals that can be forwarded to maintenance personnel or to stop operation of the generator 104 before further damage occurs.

The historical information can also be utilized, in step 214, to allow the SGNGM 102 to self-learn how the signals are changing over time so that different threshold levels can evolve as the generator's operating conditions change. Thus, voltage and current thresholds that once may have been used to trip a relay may be adjusted so as to be more sensitive so that faults are detected sooner. Also, when a fault or condition does occur in conjunction with an observed waveform (e.g., degraded winding insulation was found during an inspection about the time that a particular series of waveforms was acquired), then the database of archived information can be augmented such that those waveforms are associated with the observed condition. In other words, one or more waveforms can be identified as occurring at the same time as an observed operating condition or occurring at a period of time before an observed operating condition. In this way, future detection and analysis of similar waveforms may result in an alarm signal that recommends inspecting one or more specific components of the generator 104 or power plant.

Figure 3:
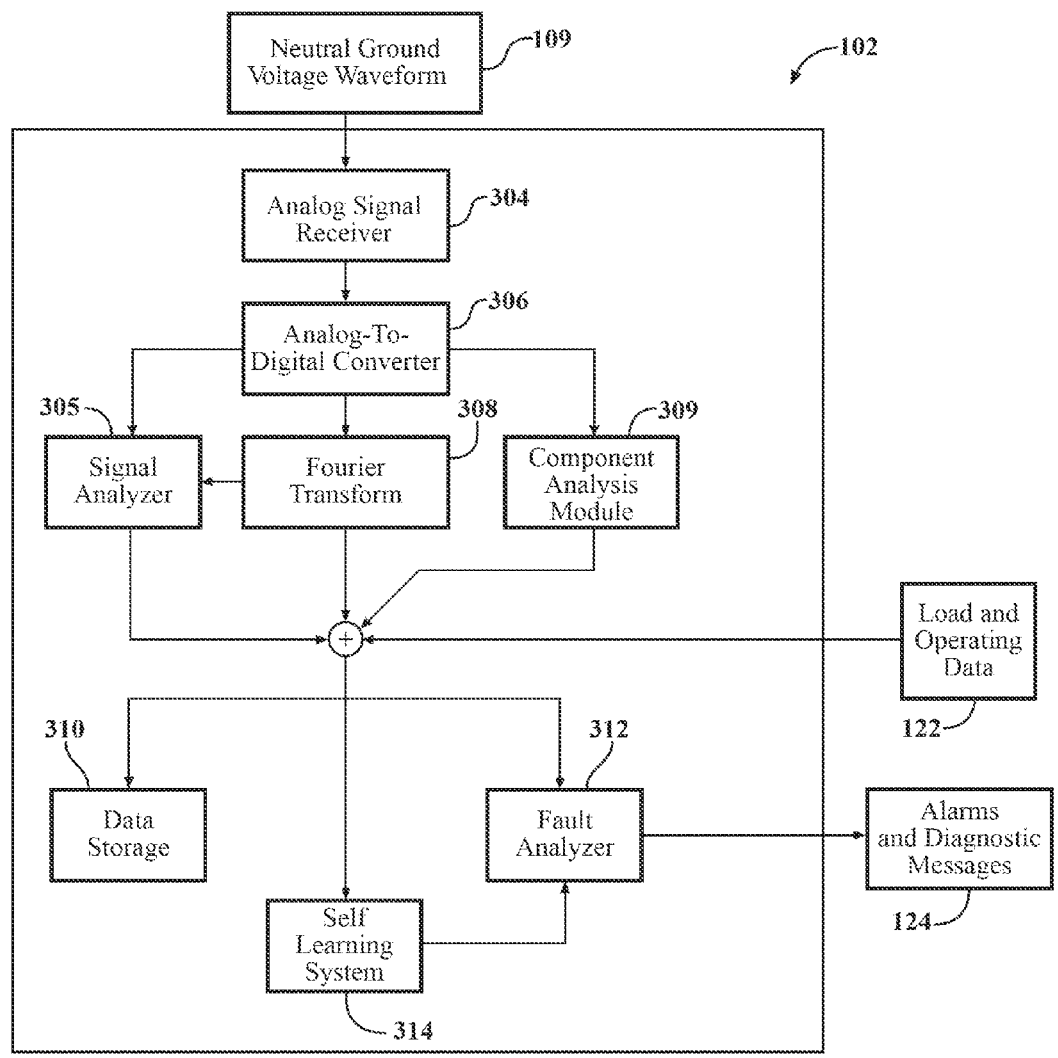
FIG. 3 illustrates a functional block-level diagram of a smart generator neutral ground monitor in accordance with the principles of the present invention.

FIG. 3 illustrates a functional block-level diagram of a smart generator neutral ground monitor in accordance with the principles of the present invention. The SGNGM 102 may be implemented as a general purpose programmable computer, or other microprocessor or microcontroller-based device. The device, in combination with various software and hardware elements can perform the process steps of the flowchart of FIG. 2. Thus, the functional blocks of FIG. 3 may refer to hardware components, software components, or a combination of the two.

The SGNGM 102 includes an analog signal receiver 304 that receives the neutral ground voltage waveform 109. The receiver 304 samples the time-based analog signal for a predetermined duration on a regular basis or in response to a trigger condition. The analog receiver 304 may filter, amplify or otherwise process the sample of the signal 109 so that further signal analysis is easier.

The sampled signal from the receiver 304 is provided to an analog-to-digital converter 306 that digitizes the sampled signal and this digital signal is provided to a Fourier transform circuit 308 to change the time-domain signal sample into a frequency-domain signal sample. The frequency-domain signal (and the time-domain signal) can be provided to a signal analyzer 305 that may determine attributes and characteristics of the respective signals. The digital signal can also be provided to a component analysis module 309 that analyzes the digital signal in order to calculate a vector characterization of the signal. A data storage system 310 is provided that stores power plant operating conditions 122, one or more attributes of the digitized signal sample, and the component analysis vectors.

In particular, the data storage system 310 can store this information in a database, for example, that allows the SGNGM 102 to compare and correlate different pieces of data with one another to recognize critical features of waveforms and faults and also operating trends involving these features. Thus, a fault analyzer 312 can search the data storage 310 for historical trends as well as analyze current waveform samples to determine if a generator fault is occurring, to predict whether a fault will occur shortly, or to identify operating conditions that could require maintenance to prevent a fault from occurring. Utilizing a self-learning module 314, the fault analyzer 312 can identify operating conditions and signal attributes that change over time and use the changed values to more accurately predict expected waveforms when performing fault analysis. As a result, various types of different operational control signals 124 for the generator 104 and for personnel operating or maintaining the generator 104 can be generated by the fault analyzer 312 such as, for example, diagnostic messages, alarm signals and trip-relay control signals.

Figure 4A:
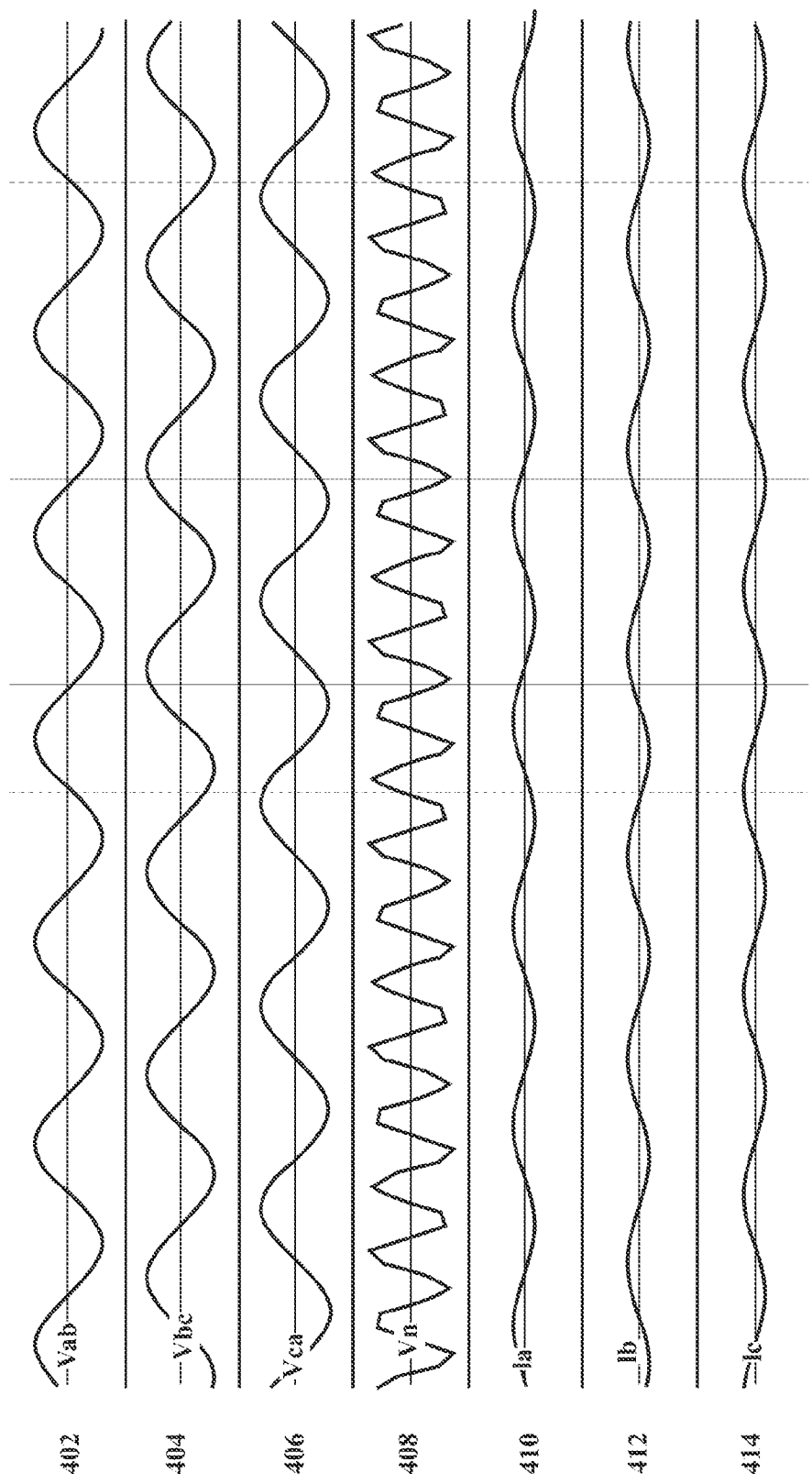

FIGS. 4A-D depict various waveforms associated with an electrical power generator including different neutral voltage waveforms of an electrical power generator. In FIG. 4A, the three different phase voltages $V_{ab}$ 402, $V_{bc}$ 404, and $V_{ca}$ 406 are shown along with corresponding phase currents $I_a$ 410, $I_b$ 412, and $I_c$ 414 for the generator 104. The neutral voltage waveform $V_n$ 408 (across the resistor 114 of FIG. 1) is also depicted. The neutral voltage waveform 408 of FIG. 4A depicts an expected neutral voltage waveform of a properly operating generator. While the specific frequency and amplitude of the neutral voltage waveform 408 can vary without departing from the scope of the invention, this waveform 408 typically has a frequency of about three-times the respective frequency of each phase voltage 402, 404, 406. The waveform $V_n$ 408 of FIG. 4A happens to depict an actual waveform sampled across a relay such as, for example, relay 118 of FIG. 1. The less-than-perfect sinusoidal nature of the waveform $V_n$ 408 is an artifact of the sampling rate used when acquiring the waveform. If a higher sampling rate were used to acquire the waveform $V_n$ 408, then its sinusoidal nature would be more evident.

Figure 4B:
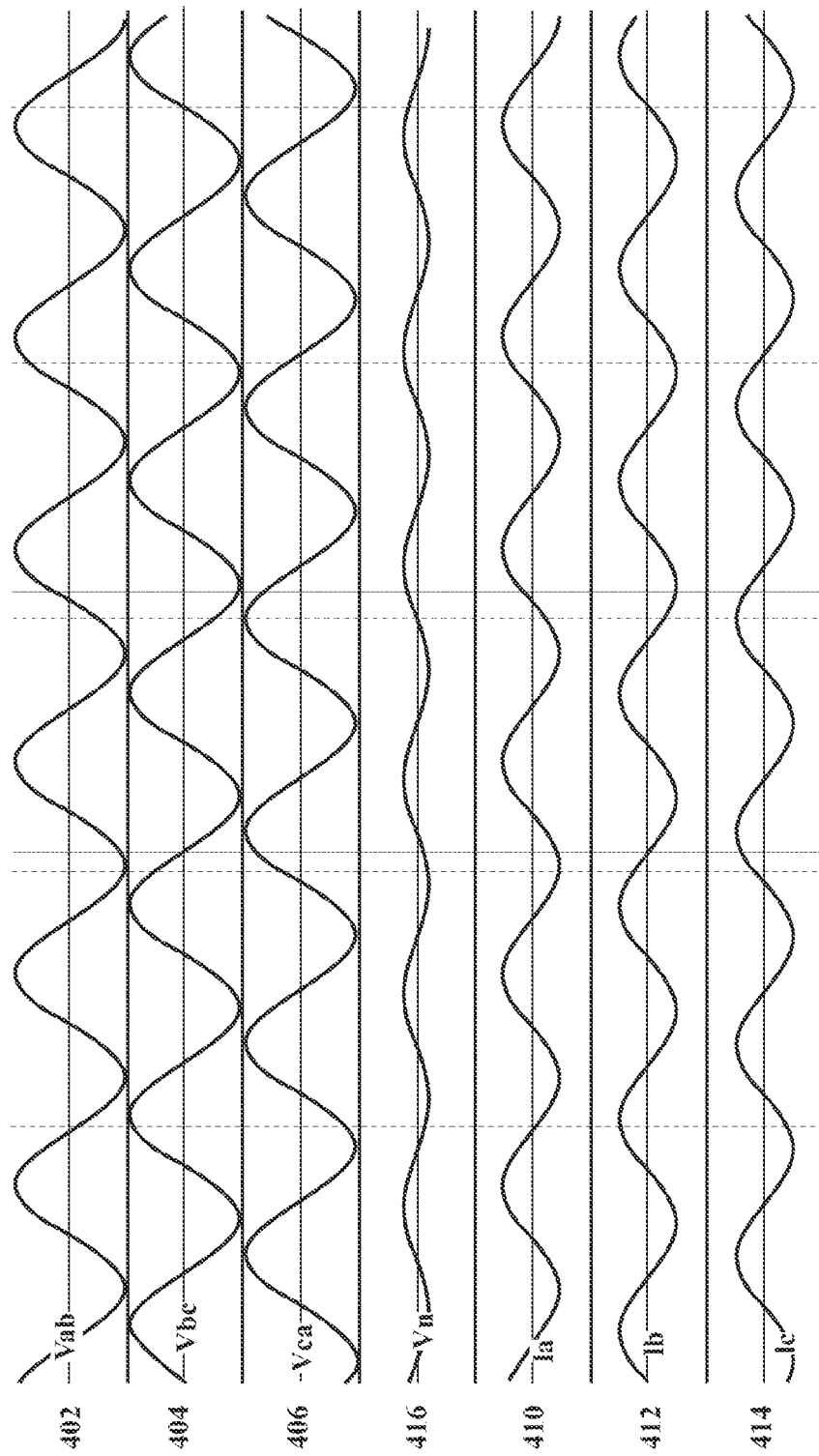

The neutral voltage waveform 416 of FIG. 4B is an example of a transient waveform across the resistor 114 that would not have resulted in the trip relay 116 actuating and stopping the operation of the generator 104. However, the neutral voltage waveform 416 is about the same frequency of $V_{bc}$ and about 180-degrees out of phase with $V_{bc}$. Thus, the shape and attributes of the waveform 416 indicate that an abnormal condition exists and, thus, can be used by the SGNGM 102 to predict the occurrence of a ground fault in the B-phase, for example.

Figure 4C:
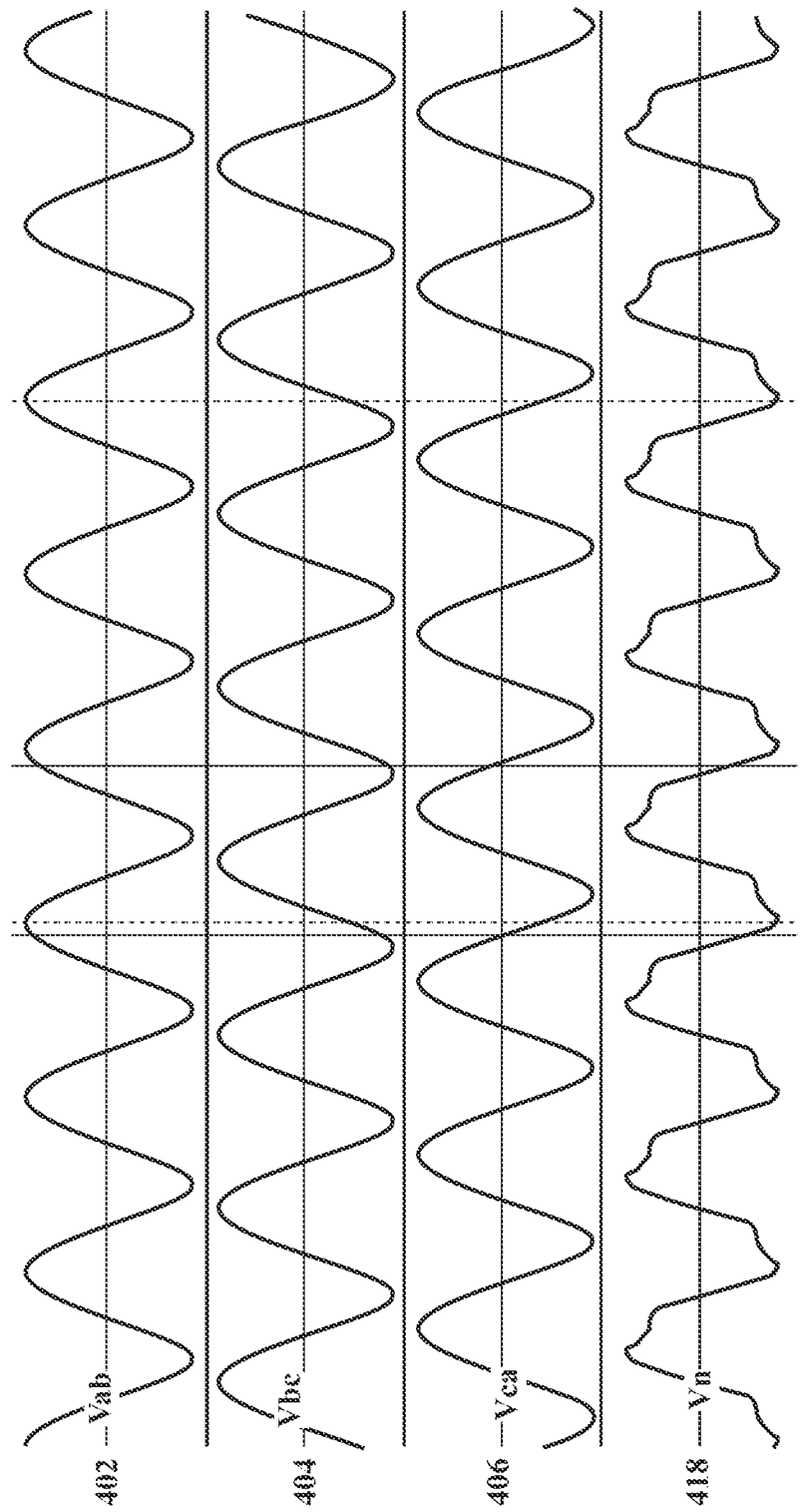

The neutral voltage waveform 418 of FIG. 4C also exhibits an abnormal shape compared to the expected waveform 408 depicted in FIG. 4A. In particular, the SGNGM 102 can determine that the neutral voltage waveform 418 has a frequency that tracks that of the three different phase voltages 402, 404, 406. Also, the SGNGM 102 can determine the shape of the waveform 418 is different than expected as well. In this instance, the SGNGM 102 can determine that the neutral voltage waveform 418 indicates a problem may exist even though the relay 116 would not have tripped yet.

The neutral voltage waveform 420 of FIG. 4D exhibits additional attributes that may cause the SGNGM 102 to determine that an operational problem is occurring or will be occurring in the future. The neutral voltage waveform 420 has an amplitude and frequency that is similar to the expected waveform 408 depicted in FIG. 4A and would not cause relay 116 to trip. However, the SGNGM 102, by analyzing the shape of the waveform 420, can determine that there is a slight ripple 422 in the waveform 420 that is in phase with the phase voltage $V_{ca}$ 406.

In the above-described figures, neutral voltage waveforms were discussed that would have occurred and disappeared without any operating personnel aware of their occurrence. However, in each instance the respective waveform was indicative of a degradation of some operational condition of the generator 104 (e.g., degradation of the insulation of one of the windings of the generator 104.) The SGNGM 102 can detect how often such a waveform is occurring. It can also determine if the occurrences of such a waveform are occurring more frequently. In either case, the SGNGM 102 can generate a diagnostic message that predicts a time frame, based on historical data, in which a fault is likely to occur and also identify a likely cause of the predicted fault. In this way, a forced outage can be prevented and preventive maintenance can be utilized to maintain the operation of a power generator. In addition to stator winding ground faults, other faults that can be detected and predicted using waveform analysis include open circuits, winding arcing, sparking in the transformer, deteriorating grounding brushes, and winding erosion. Each type of fault will have a respective waveform, similar to those of FIGS. 4B-4D, with its own characterizing attributes that can be detected and learned by the SGNGM 102 in order to provide warnings and alarms related to a variety of different faults.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method comprising:
   monitoring a voltage waveform across a second winding of a neutral grounding transformer of a three-phase generator, wherein the three-phase generator comprises a neutral bus bar, and the neutral grounding transformer comprises a primary winding and the second winding, the primary winding electrically coupling the neutral bus bar to ground;
   acquiring a present sample of the voltage waveform;
   comparing the present sample to one or more of a plurality of past samples of the voltage waveform;
   based on a similarity between the present sample to the one or more past samples, identifying a generator fault associated with the present sample;
   generating an operational control signal for the three-phase generator based on the generator fault.

2. The method of claim 1, wherein identifying the generator fault includes determining that the present sample indicates that the generator fault has occurred.

3. The method of claim 1, wherein identifying the generator fault includes predicting a future timeframe in which the generator fault will occur.

4. The method of claim 1, wherein identifying the generator fault includes determining a component related to the generator fault.

5. The method of claim 4, wherein the component includes stator winding insulation.

6. The method of claim 1, further comprising:
   storing the plurality of past samples of the voltage waveform in a database system.

7. The method of claim 1, wherein acquiring a present sample includes:
   converting the present sample from an analog signal to a digital signal;
   converting the digital signal from a time-domain signal to a frequency-domain signal; determining at least one attribute related to the frequency-domain signal.

8. The method of claim 1, further comprising:
   converting the present sample from an analog signal to a digital signal;
   performing component analysis on the digital signal; and
   generating from the component analysis one or more vectors characterizing the digital signal.

9. The method of claim 1, wherein identifying the generator fault includes considering power plant operating conditions in conjunction with the present sample and the one or more past samples.

10. The method of claim 1, further comprising:
    predicting an expected waveform of the present sample based on the one or more past samples.

11. A system comprising:
    a voltage monitoring circuit configured to monitor a voltage waveform across a second winding of a neutral grounding transformer of a three-phase generator, wherein the three-phase generator comprises a neutral bus bar, and the neutral grounding transformer comprises a primary winding and the second winding, the primary winding electrically coupling the neutral bus bar to ground;
    a signal receiver configured to acquire a present sample of the voltage waveform; a comparator configured to compare the present sample to one or more of a plurality of past samples of the voltage waveform;
    a fault analyzer configured to identify a generator fault associated with the present sample based on a similarity between the present sample to the one or more past samples; and
    a signal generator configured to generate an operational control signal for the three-phase generator based on the generator fault.

12. The system of claim 11, wherein the fault analyzer is configured to determine that the present sample indicates that the generator fault has occurred.

13. The system of claim 11, wherein the fault analyzer is configured to predict a future timeframe in which the generator fault will occur.

14. The system of claim 11, wherein the fault analyzer is configured to determine a component related to the generator fault.

15. The system of claim 14, wherein the component includes stator winding insulation.

16. The system of claim 11, further comprising:
    a database system configured to store the plurality of past samples of the voltage waveform.

17. The system of claim 11, further comprising:
    an analog to digital converter configured to convert the present sample from an analog signal to a digital signal;
    a Fourier transformer configured to convert the digital signal from a time-domain signal to a frequency-domain signal; and
    a signal analyzer configured to determine at least one attribute associated with the frequency-domain signal.

18. The system of claim 11, further comprising:
    an analog to digital converter configured to convert the present sample from an analog signal to a digital signal; and
    a component analyzer configured to generate one or more vectors characterizing the digital signal.

19. The system of claim 11, wherein the fault analyzer is configured to receive and utilize power plant operating conditions in conjunction with the present sample and the one or more past samples.

20. The system of claim 11, wherein the fault analyzer is configured to predict an expected waveform of the present sample based on the one or more past samples.

* * * * *